(12) United States Patent  (10) Patent No.: US 9,071,277 B1
Franceschini et al.  (45) Date of Patent: Jun. 30, 2015

(54) CORRECTION OF STRUCTURED BURST ERRORS IN DATA

(75) Inventors: Michele M. Franceschini, White Plains, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 13/556,561

(22) Filed: Jul. 24, 2012

Related U.S. Application Data (63) Continuation of application No. 13/538,214, filed on Jun. 29, 2012.

(51) Int. Cl.
| | |
|---|---|
| *H03M 13/29* | (2006.01) |
| *G06F 11/10* | (2006.01) |
| *H03M 13/15* | (2006.01) |
| *H04L 1/00* | (2006.01) |

(52) U.S. Cl.
CPC ............ *H03M 13/15* (2013.01); *H04L 1/0045* (2013.01)

(58) Field of Classification Search
CPC ..... G06F 3/0312; G06F 11/1044; G06F 8/44; G11C 29/00; H03M 13/15; H03M 13/152; H03M 13/2906; H03M 13/17; H04L 1/0045
See application file for complete search history.

(56) References Cited

U.S. PATENT DOCUMENTS

| | | | | |
|---|---|---|---|---|
| 5,771,246 | A * | 6/1998 | Weng | 714/762 |
| 6,981,197 | B2 * | 12/2005 | Liu et al. | 714/765 |
| 7,289,476 | B2 * | 10/2007 | Varshney et al. | 370/335 |
| 2002/0108087 | A1 * | 8/2002 | Liu et al. | 714/765 |
| 2003/0008623 | A1 | 1/2003 | Uesugi | |
| 2003/0063680 | A1 | 4/2003 | Nedic et al. | |
| 2003/0182615 | A1 * | 9/2003 | Gallezot et al. | 714/785 |
| 2005/0005193 | A1 * | 1/2005 | Nakagawa et al. | 714/6 |
| 2005/0204267 | A1 * | 9/2005 | Nakagawa et al. | 714/770 |
| 2008/0052597 | A1 * | 2/2008 | Valliappan et al. | 714/762 |
| 2009/0287983 | A1 * | 11/2009 | Truong et al. | 714/785 |
| 2010/0031120 | A1 * | 2/2010 | Belogolovy et al. | 714/762 |
| 2010/0131821 | A1 * | 5/2010 | Takagi et al. | 714/756 |
| 2010/0162083 | A1 * | 6/2010 | Chung et al. | 714/764 |
| 2010/0293433 | A1 | 11/2010 | Limberg | |
| 2011/0119561 | A1 * | 5/2011 | Lee et al. | 714/764 |
| 2011/0138250 | A1 | 6/2011 | Ganga et al. | |
| 2012/0317458 | A1 * | 12/2012 | So et al. | 714/763 |
| 2013/0166988 | A1 * | 6/2013 | Sharon et al. | 714/758 |

OTHER PUBLICATIONS

Sriram, N.M., et al., "Burst error correction using partial fourier matrices and block sparse representation", Communications (NCC), 2012 National Conference on, Conference Dates: Feb. 3-5, 2012.*
U.S. Appl. No. 13/538,214; Non Final Office Action; Date Filed: Jun. 29, 2012; Date Mailed: Oct. 3, 2013; pp. 1-22.
U.S. Appl. No. 13/538,214; Final Office Action; Date Filed: Jun. 29, 2012, Date Mailed: Feb. 14, 2014; pp. 1-28.

* cited by examiner

*Primary Examiner* — Albert Decady
*Assistant Examiner* — Kyle Vallecillo
(74) *Attorney, Agent, or Firm* — Cantor Colburn LLP (57) ABSTRACT

Correction of structured burst errors in data is provided by a system that includes an encoder and is configured for performing a method. The method includes receiving data that includes a plurality of subsets of data. The data is encoded by an encoder using a combination of a first error correcting code and a second error correcting code. The first error correcting code is configured to provide error recovery from a structured burst error in one of the subsets of data, the structured burst error having a length less than a specified maximum length. The second error correcting code is configured to extend the first error correcting code to provide error recovery from the structured burst error in any of the subsets of data. The encoded data is output.

20 Claims, 3 Drawing Sheets

CORRECTION OF STRUCTURED BURST ERRORS IN DATA

CROSS-REFERENCE TO RELATED APPLICATION

This application is a continuation of U.S. patent application Ser. No. 13/538,214 filed Jun. 29, 2012, the disclosure of which is incorporated by referenced herein in its entirety.

This invention was made with Government support under Contract No.: MDA972-03-3-0004 awarded by Defense Advanced Research Projects Agency (DARPA). The Government has certain rights in this invention.

BACKGROUND

The present invention relates to error correction, and more specifically, to the correction of structured burst errors in data.

The simplest error correction codes protect against random errors that are introduced into a data stream. The errors are modeled as random events with no statistical correlation to each other or any part of the overall system. Additional bits are added to the data to protect against errors. The effect of the additional error correction bits is to map the un-coded data into a coded domain. In the coded domain, valid code words are selected to represent the un-coded data, and all other invalid code words are assumed to result from transmission errors.

There is a growing trend toward the use of decision feedback equalization (DFE) in high speed interfaces for transmitting data. DFE uses the history of what was transmitted before to help in determining the value of a current bit. This powerful equalization works well to remove inter-symbol interference. However, DFE tends to transform single bit errors into multi-bit burst errors. For example, if noise causes a single bit to switch polarity, the feedback nature of DFE will recirculate the error and use the wrong information in the future decisions. The resulting error in general has structure, given by the design of the DFE itself; and although the error in general could propagate forward for an unbounded number of bits, in the vast majority of the cases one can establish a maximum burst length.

SUMMARY

Embodiments include a system for generating encoded data. The system includes an encoder and is configured for performing a method that includes receiving data that includes a plurality of subsets of data. The received data is encoded by an encoder using a combination of a first error correcting code and a second error correcting code. The first error correcting code is configured to provide error recovery from a structured burst error in one of the subsets of data, the structured burst error having a length less than a specified maximum length. The second error correcting code is configured to extend the first error correcting code to provide error recovery from the structured burst error in any of the subsets of data. The encoded data is output.

Embodiments also include a system for generating encoded data. The system includes a differential feedback equalizer (DFE) receiver and an encoder. The system is configured for performing a method that includes receiving data that includes a plurality of subsets of data. The data is receved from the DFE receiver. The received data is encoded by an encoder using a combination of a first error correcting code and a second error correcting code. The first error correcting code is configured to provide error recovery from a structured burst error in one of the subsets of data, the structured burst error having a length less than a specified maximum length. The second error correcting code is configured to extend the first error correcting code to provide error recovery from the structured burst error in any of the subsets of data. The encoded data is output.

Embodiments further include a system for generating decoded data. The system includes a decoder and is configured to perform a method that includes receiving data that includes a plurality of subsets of data. The received data also includes a structured burst error in one of the subsets of data. The structured burst error has a length less than a specified maximum length. The received data is decoded by the decoder using a combination of a first error correcting code and a second error correcting code. The first error correcting code is configured to provide error recovery from the structured burst error in one of the subsets of data. The second error correcting code is configured to extend the first error correcting code to provide error recovery from the structured burst error in any of the subsets of data. The decoded data is output.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present invention provide techniques for constructing codes for correcting burst errors that have a known structure; for example bursts having a length of at most "b" and a Hamming weight of at most "t". Embodiments described herein modify codes that are applied to generic burst errors by replacing a portion of their check matrix with a more efficient check matrix based on the additional constraints imposed on the structure of the bursts. In an embodiment, codes such as, but not limited to, the Fire, Burton and Gilbert codes are modified to address burst errors with a maximum Hamming weight, burst errors with solid errors, and multiple solid burst errors. The redundancy of an embodiment of the codes described herein are optimal within the class of cyclic codes.

An example Fire code is described, for example, in P. Fire, "A Class of Multiple-Error Correcting Binary Codes for Non- Independent Errors," *Sylvania Report RSL-E-2, Sylvania Reconnaissance Systems Lab*, Mountain View, Calif., 1959. An example Burton code is described, for example, H. O. Burton, "A Class of Asymptotically Optimal Burst-Correcting Block Codes," *International Communications Conference*, Boulder, Colo., 1969. An example Gilbert code is described, for example, in E. N. Gilbert, "A Problem in Binary Encoding," Proceedings of the Symposium on Applied Mathematics, 1960.

Figure 1:
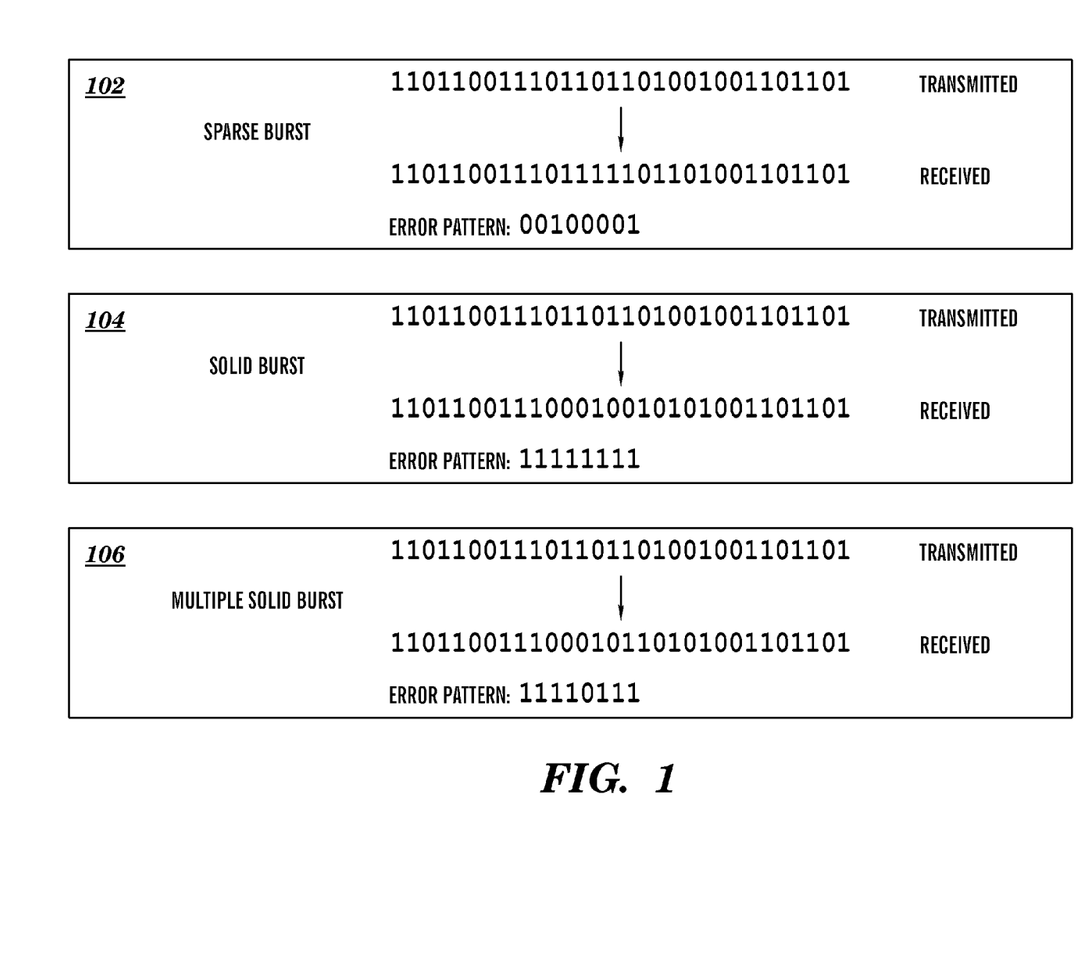
FIG. 1 illustrates example structured burst errors in accordance with an embodiment.

Turning now to FIG. 1, structured burst errors in accordance with embodiments are generally shown. It should be understood that the structured burst errors shown in FIG. 1 are examples and that other structured burst errors may also be corrected for by embodiments described herein. Sparse burst error 102 shown in FIG. 1 represents a case where a burst is known to be very sparse in errors (two in the example shown in FIG. 1) when the burst error occurs. Another burst error pattern shown in FIG. 1 is a solid burst error 104 that includes a streak of uninterrupted errors with a bound on the maximum length of the streak. Another example of a burst error pattern shown in FIG. 1 is a multiple solid burst error 106 that includes more than one solid burst error. Multiple solid burst errors can arise, for example, from multi-state channel models where there is an underlying physical mechanism that increases the propensity to have errors. There are several applications, such as those described herein, which may exhibit structured burst error patterns such as those shown in FIG. 1 and where it desirable to be above to correct structured burst errors.

Figure 2:
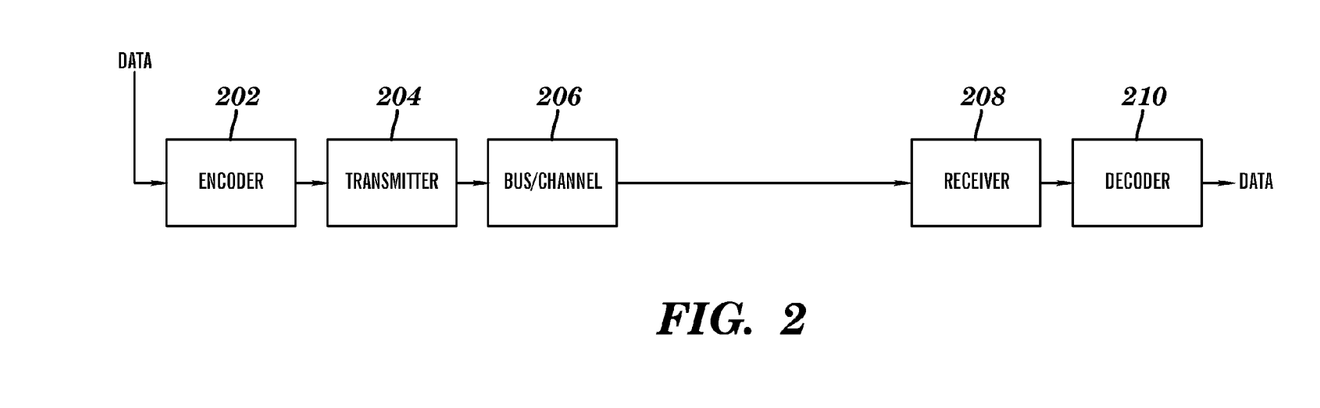
FIG. 2 illustrates a block diagram of a system where structured burst errors in data are corrected in accordance with an embodiment.

FIG. 2 illustrates a block diagram of a system where structured burst errors in data are corrected in accordance with an embodiment. As shown in FIG. 2, data is input to an encoder 202 for encoding prior to being sent to a transmitter 204 for transmission across a bus (or channel) 206. In an embodiment the encoder 202 and the transmitter 204 are located in a single device; in another embodiment they are located in separate devices. The bus 206 may introduce a structured burst error due to for example, to a differential feedback equalizer (DFE) receiver making an incorrect decision, causing error propagation. As shown in FIG. 2, the data is received at a receiver 208 and input to a decoder 210 to remove, for example, any structured burst errors introduced by the bus 206. In an embodiment the receiver 208 and decoder 210 are located in a single device; in another embodiment they are located in separate devices. The data is then output from the decoder 210. Typically the bus (or channel) is a data communication bus connecting a memory to a processor, a processor to a processor, a network interface card to another network interface card, a router to a router, etc. Correspondingly, the output from the decoder 210 is typically fed to a consuming device (e.g. a processor) or relayed through another communication channel.

Figure 3:
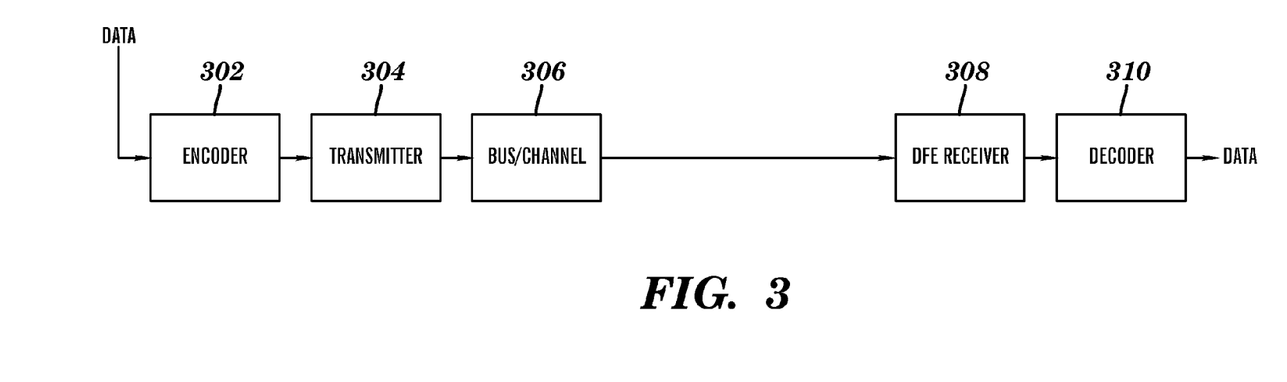
FIG. 3 illustrates a block diagram of a system that includes a differential feedback equalizer (DFE) circuit where structured burst errors in data are corrected in accordance with an embodiment.

FIG. 3 illustrates a block diagram of a system that includes a differential feedback equalizer (DFE) circuit where structured burst errors in data are corrected in accordance with an embodiment. As shown in FIG. 3, data is input to an encoder 302 for encoding prior to being sent to a transmitter 304 for transmission across a bus (or channel) 306. In an embodiment the encoder 302 and the transmitter 304 are located in a single device; in another embodiment they are located in separate devices. As shown in FIG. 3, the data is received at DFE receiver 208 and input to a decoder 310 to remove, for example, any structured burst errors introduced by the bus 306 and/or the DFE receiver 308. In an embodiment, the DFE receiver 308 shown in FIG. 3 employs differential feedback equalization that with one tap of feedback can cause solid burst errors. In an embodiment the DFE receiver 308 and the decoder 310 are located in a single device; in another embodiment they are located in separate devices. The data is then output from the decoder 310.

Existing codes to correct for solid burst errors are generally generic cyclic codes, which are generally inefficient when an upper bound can be placed on the length of the solid burst. As used herein, the term inefficient means that the number of redundant bits that they employ for a given task is higher than the number of redundant bits that are in principle sufficient for the task.

Current solutions for dealing with burst error correction are far from optimal in terms of the amount of redundancy required for a given error correction capability, particularly for relatively small burst sizes (e.g., errors within a window of 8 or 16 bits).

Embodiments described herein provide a general code construction technique that gives good results in certain defined cases. Existing burst error correcting codes are modified and their required redundancy reduced by leveraging the additional information given by the burst structure. For example, embodiments described herein modify cyclic codes whose generator polynomial can be written as $$(x^i-1)p(x) \tag{1}$$

for some integer k and some polynomial p(x).

It turns out that under proper conditions, it is possible to substitute the factor $x^i-1$ with a factor of lower degree when the class of burst errors to be corrected is restricted. Embodiments described herein result in codes that are within one bit of a redundancy lower bound discussed later herein, in fact in at least one embodiment, the redundancy is optimal within the class of cyclic codes of a given length. The techniques for decoding these modified codes may be derived from available techniques for decoding the originating parent code, further enhancing the attractiveness of the code construction embodiments described herein.

Figure 4:
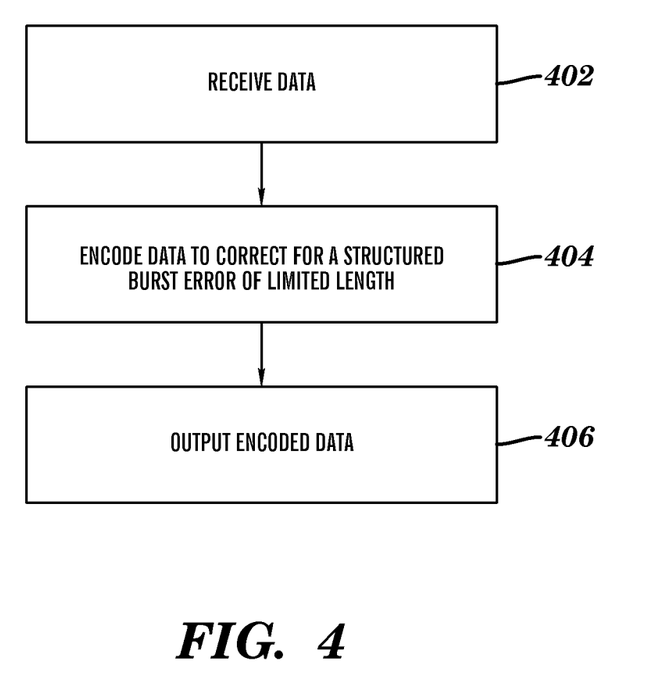
FIG. 4 illustrates a block diagram of a process for generating encoded data to correct for structured burst errors in accordance with an embodiment.

FIG. 4 illustrates a block diagram of a process for generating encoded data to correct for structured burst errors in accordance with an embodiment. In an embodiment, the process is performed by an encoder, such as encoder 202 in FIG. 2 or encoder 302 in FIG. 3. At block 402 in FIG. 4, data that includes a plurality of subsets of data is received (e.g., from a DFE receiver, a memory, a bus/channel, etc.). In an embodiment, at least two of the subsets of data in the received data overlap with each other. At block 404, the data is encoded by an encoder to allow for correction of structured burst errors of limited length. A burst is referred to as having a limited length when the number of bits, whether in error or not, between the first bit of the burst and the last bit of the burst is no higher than a given limited length threshold. In an embodiment the encoding is performed using a combination of a first error correcting code and a second error correcting code. The first error correcting code is configured to provide error recovery from a structured burst error in one of the subsets of data. The structured burst error has a length less than a specified maximum length, i.e., it is of a limited length. The specified length may be set by the encoder at system start up and/or it may be adjusted programmatically during operation of the encoder. The second error correcting code is configured to extend the first error correcting code to provide error recovery from the structured burst error in any of the subsets of data.

The combination of the first error correcting code (also referred to as "first error control code" or "first code") with a second error correcting code (also referred to as "second error control code" or "second code") can be explained from the perspective of parity check matrices. Suppose that the first code is associated with a parity check matrix H1 and the second code is associated with a parity check matrix H2. Here it is assumed that the number of rows in a parity check matrix is equal to the number of redundant bits of the corresponding code, and that the number of columns of a parity check matrix is equal to the length of the code. By assumption, the first code applies to only a subset of the bits, in other words the number of columns of H1, referred to herein as n1, is smaller than the overall codeword length, which is referred to herein as n. The first step is to concatenate the columns of the matrix H1 n/n1 times (in this example it is assumed that n divides n1; if not, the last concatenation would simply be incomplete), resulting in a matrix with the same number of rows, but a total of n columns.

The second step is to do the same for the matrix H2. In this case, the matrix H2 may already be of length n, or may be of length n2 smaller than n. In the case it already has the same length, no other preparation step is needed. If n2<n, then it is also replicated n/n2 times (again assuming that n is a multiple of n2, so that n in this example can be the least common multiple of n1 and n2).

The third and final step is to concatenate the rows (as opposed to the colums) matrices resulting from steps 1 and 2, resulting in a matrix with a number of rows equal to the number of rows in H1 added to the number of rows in H2, and with a number of columns equal to n. The resulting matrix from the third step is a parity check matrix that is used for the structured burst error correcting code, in other words, it is the parity check matrix of the result of combining the first code and the second code with the method described above.

It will be understood that there are several representations of the resulting matrix from step 3 that are equivalent in terms of code performance. That is, even if a parity check matrix for a structured burst error correcting code cannot be said to be produced exactly by the process above, it may still be the case that one can pre-multiply times an invertible matrix that would result in a matrix that can be said to be produced by the procedure above. Since pre-multiplication times an invertible matrix does not result in changing the fundamental properties of a code, embodiments described herein result in all codes with parity check matrices equivalent to one that can be produced by the method given above.

In an embodiment, the structured burst error is a sparse burst error having a weight less than a specified maximum weight and the first error correcting code is selected based on the structured burst error being a sparse burst error having a weight less than the specified maximum weight. The specified maximum weight may be set by the encoder at system start up and/or it may be adjusted programmatically while the encoder is operating. In an embodiment, the structured burst error is a solid burst error and the first error correcting code is selected based on the structured burst error being a solid burst error. In an embodiment the structured burst error is multiple solid burst error made up of multiple solid burst errors and the first error correcting code is selected based on the structured burst error being a multiple solid burst error.

In an embodiment, the first error correcting code is a cyclic code. In another embodiment, the first error correcting code is a Bose, Chaudhuri and Hocquenghem (BCH) code. In an embodiment, the second error correcting code is generated by polynomial that is irreducible. In another embodiment, the combination of the first error correcting code and the second error correct code is generated by the product of two polynomials.

In an embodiment, the first error correcting code utilizes codewords of a first length, and the second error correcting code utilizes codewords of a second length. In an embodiment the combination of the first error correcting code and the second error code utilizes codewords of a third length that is larger than both the first length and the second length.

At block 406, the data is output. In an embodiment, the data is output to a DFE receiver.

An embodiment also includes a method for generating decoded data. The method includes receiving data that includes a plurality of subsets of data. The received data also includes a structured burst error in one of the subsets of data. The structured burst error has a length less than a specified maximum length. The received data is decoded by a decoder (such as decoder 210 in FIG. 2 or decoder 310 in FIG. 3) using a combination of a first error correcting code and a second error correcting code. The first error correcting code is configured to provide error recovery from the structured burst error in one of the subsets of data. The second error correcting code is configured to extend the first error correcting code to provide error recovery from the structured burst error in any of the subsets of data. The decoded data is output.

Detailed Implementations of Embodiments

Following is a detailed description of codes for the correction of structured burst errors in data that may be implemented by various embodiments of the present invention.

In an embodiment, a full rank parity check matrix, H, has an associated code that is good for correcting some class of errors. The class of errors has some property (e.g., bursty with sparse burst errors) such that if e is an error vector within that class, the syndrome He can always be recovered from $\hat{H}e$, and hence e itself due to the starting assumption that the code with check matrix H can correct the given class of errors. In this example, $\hat{H}$ is a matrix with fewer rows than H. If a code with parity check matrix $\hat{H}$ is employed instead, the same class of errors could always be corrected, but with fewer redundant bits.

This idea is used in an embodiment described herein to describe the case where the parity check matrix H with n columns can be written as:

$$H = \begin{bmatrix} I_l & I_l & \cdots & I_l \\ & H_1 & \end{bmatrix}$$

for a square identity matrix I of size l×l. Then, e is partitioned as $e=[e_0, \ldots, e_{(n-1)/l}]$ with each $e_i$ being a vector of length l (assuming l divides n). Note that $[I_l\ I_l\ \ldots\ I_l]e=\Sigma_i e_i$. If for example, e has at most t errors then $\Sigma_i e_i$ also has at most t errors and thus every instance of $I_e$ can be substituted with a parity check matrix M defining a first code of length l and distance t+1, and $\Sigma_i e_i$ is always recoverable. Thus, based on the description above, it can be concluded the more efficient parity check matrix $$H = \begin{bmatrix} M & M & \cdots & M \\ & H_1 & \end{bmatrix}$$

may be used to correct the class of errors of interest. Note that the first code with parity check matrix M can only be used to correct an error pattern with a subset of bits of length l. Nonetheless the second code H1 is in effect increasing the length of the first code, effectively creating a code of larger length n. Generally speaking, the total codeword of length n is comprised of multiple, possibly overlapping, subsets of data, in this case of length l, and the first error correcting code is configured to provide error recovery from a structured burst error in one of the subsets of data. Because l is smaller than n, a second error correcting code configured to extend the first error correcting code is added to provide error recovery from the structured burst error in any of the subsets of data.

Mathematical Preliminaries.

Let $a \in F_q^n$. Define $a(x)$ to be the polynomial $\Sigma_{i=0}^{n-1} a_i x^i$. Conversely, if $a(x)$ is defined to be a polynomial with degree at most n, then a refers to the n-length vector comprising the coefficients of the polynomial $a(x)$. Both of these notations (a and $a(x)$) are used herein.

A weight function $w_n$ is a mapping $F_q^n \to \mathbb{Z}$ with the property that for any two a, $b \in F_q^n$, $w_n(a+b) \leq w_n(a) + w_n(b)$ and if $a \neq 0$, then $w_n(a) > 0$. A class of weight functions $w = \{w_i\}_{i=1}^\infty$ is a collection of weight functions for every possible vector length parameter. The same notation is used for a weight function independently of whether the argument is a vector or a polynomial.

Since embodiments described herein will be focusing on cyclic codes, it is assumed that the $w_n$-weight of a vector or polynomial remains invariant with cyclic shifts: for every $j>1$, and $v(x)$ with deg $v(x)<n$, $w_n(x^j v(x) \bmod x^n - 1) = w_n(v(x))$.

It is said that a polynomial $f(x)$ gives $w_n$-weight non-increasing residues, if for every polynomial $v(x)$ such that deg $v(x)<n$, $$w_{\deg(f(x))}(v(x) \bmod f(x)) \leq w_n(v(x)).$$

The class of Hamming weight functions defines the weight of $v \in F_q^n$ as $w_n^H(v) = |\{i \in \{0, \ldots, n-1\} : v_i \neq 0\}|$. It is easy to see that for every integer, j, the polynomial $x^j - 1$ gives $w_n^H$-weight non-increasing residues.

For another example of a weight function, consider the problem of counting the number of (generic) bursts of length at most $b \geq 1$ in a vector. A burst of length at most b is a polynomial $x^j e(x)$ with $e_0 \neq 0$ and deg $e(x)<b$. Define the set of cyclic burst covers as follows:

$$\mathcal{C}_{b,n} = \{\{i, \ldots, i+b-1\} \bmod n : i \geq 0\}$$

Thus each element of $\mathcal{C}_{b,n}$ is a set of b (modulo n) consecutive integers. The burst weight function can then be defined as follows:

$$w_n^B(v(x), b) = \min |W|$$

where the minimization is over all $W \subset \mathcal{C}_{b,n}$ such that $\forall v_j \neq 0$, there exists a cyclic burst cover $c \in W$ such that $j \in c$. The minimizing W is in general not unique. This burst weight function can be regarded as a count of the number of bursts of length at most b in $v(x)$.

The following result:

Lemma 1. If $l | n$ for positive integers l, n, b, then the polynomial $x^l - 1$ gives $w_n^B(\cdot, b)$-weight non-increasing residues.

For any weight function $w_n$, it is said that cyclic code with generator $g(x)$ and code length n has $w_n$-minimum distance d if for every nonzero $v(x)$ with deg $v(x)<n$ $v(x) \bmod g(x) = 0$ implies that $w_n(v(x)) \geq d$.

It is said that a cyclic code with generator $g(x)$ can correct the class of error patterns $\epsilon_n$ if for every a, $b \in \epsilon_n$ with $a(x) \neq b(x)$, $a(x) \bmod g(x) \neq b(x) \bmod g(x)$.

Finally, basic facts used herein include: (1) if $a|c$ and $b|c$ then lcm $(a,b)|c$; (2) lcm$(a, b, c)=$lcm$(a,$ lcm$(b, c))$; (3) the polynomial $x^m - 1$ divides $x^n - 1$ if and only if m divides n; and (4) for any two polynomials $p_0(x), p_1(x)$, if $v(x) \bmod p_0(x) \neq 0$, then $v(x) \bmod \text{lcm}(p_0(x), p_1(x)) \neq 0$.

The basic tool.

Theorem 1. Let a class of weight functions $w = \{w_j\}_{j=1}^\infty$ be given. Assume that $g(x)$ and l are such that the n-length cyclic code generated by $$\text{lcm}(g(x), x^l - 1) \tag{2}$$

can correct the class of errors $\epsilon_n$. Let $$T = \max_{e(x) \in \epsilon_n} w_n(e(x))$$

and assume that $x^l - 1$ gives $w_n$-weight non-increasing residues. Let $d(x)$ be a divisor of $x^l - 1$ generating a cyclic code of length l with $w_l$-minimum distance at least $2T+1$. Then the cyclic code generated by:

$$\text{lcm}(g(x), d(x))$$

has the same length n and can also correct the class $\epsilon_n$. In here, $d(x)$ is the generator polynomial of a first code that can correct a structured burst for a transmission of length l and the polynomial $d(x)$ generates a second code that is used to lengthen the first code. In our invention, the length n of the code thus generated is larger than either of the lengths of the codes generated by $g(x)$ or $d(x)$ individually.

Proof. Let $e_1(x), e_2(x) \in \epsilon_n$ be such that $v(x) =^\Delta e_1(x) - e_2(x) \neq 0$. Then because the class $\epsilon_n$ is correctable by (2), $v(x)$ mod lcm$(g(x), x^l - 1) \neq 0$. At least one of the following must be true:

$$v(x) \bmod g(x) \neq 0$$

$$v(x) \bmod x^l - 1 \neq 0$$

because if two polynomials divide a third one, the least common multiple of the two polynomials must also divide the third one.

If the first condition is true, then from basic fact (4) necessarily $v(x)$ mod lcm$(g(x), d(x)) \neq 0$, and the theorem is proved. If the second statement is true, then $w_l(v(x) \bmod x^l - 1) > 0$ and since $w_n(v(x)) = w_n(e_1(x) - e_2(x))$ $w_n(e_1(x)) + w_n(e_2(x)) \leq 2T$ and $x^l - 1$ gives $w_n$-weight non increasing residues, $$0 < w_l(v(x) \bmod x^l - 1) \leq 2T.$$

Define $r(x) = v(x) \bmod x^l - 1$. Since the code generated by $d(x)$ has length l and also has $w_l$-minimum distance at least $2T+1$, then $r(x) \bmod d(x) \neq 0$. Let $q(x)$ be such that: $(x) = (x^l - 1) q(x) + r(x)$. Taking the modulus with respect to $d(x)$ and recalling that $d(x)$ divides $x^l - 1$, results in:

$$v(x) \bmod d(x) = r(x) \bmod d(x) \neq 0$$

Finally through a second application of basic fact (4) $v(x)$ mod lcm$(g(x), d(x)) \neq 0$ is obtained.

It remains to analyze the lengths of the codes. Let $n_1$ be the smallest positive integer such that lcm$(g(x), x^l - 1) | (x^{n_1} - 1)$, and let $n_2$ be the smallest positive integer such that lcm$(g(x), d(x)) | (x^{n_2} - 1)$. It is known that lcm$(g(x), d(x)) | $lcm$(g(x), x^l - 1)$, and thus $n_2 \leq n_1$. By assumption on $d(x)$, $d(x)$ divides a polynomial of the form $x^i - 1$ only if $i \geq l$. Therefore since $d(x) | (x^{n_2} - 1)$, it is true that $n_2 \geq l$; in addition it must be true from basic fact (3) that $n_2 = l \theta$ for some positive integer $\theta$. This implies that $x^l - 1 | x^{n_2} - 1$. This, together with the assumption that $g(x) | x^{n_2} - 1$, implies that lcm$g(x), x^l - 1 | x^{n_2} - 1$ and therefore $n_1 \leq n_2$. We conclude that $n_1 = n_2$.

Applications.

Codes for Bursts with Maximum Hamming Weight Based on a Fire Code Construction.

Fire codes are single (generic) b-burst error correcting codes defined by a generator polynomial of the form:

$$(x^{2b-1}-1)p(x) \quad (3)$$

where p(x) is a primitive polynomial of degree m≥b that does not divide $x^{2b-1}-1$. The length of the code is lcm(2b−1, gm−1). It is assumed in this section that binary codes (q=2) are being used.

Suppose now that it is desired to correct one burst of length at most b containing at most t binary errors, for the same code length. With reference to Theorem 1, a polynomial d(x)| $(x^{2b-1}-1)$ generating a cyclic code of length 2b−1 is identified and that also has minimum Hamming distance of at least 2t+1. Once in possession of such polynomial, by Theorem 1, the code with generator polynomial lcm(d(x),p(x))=d(x)p(x) would have the desired attributes. As for candidates for d(x), the class of Bose, Chaudhuri and Hocquenghem (BCH) codes and close relatives immediately come to mind.

TABLE I

| deg d(x) | deg p(x) | b | n | t | r (bits) | Lower bound (bits) | Cyclic lower bound |
|---|---|---|---|---|---|---|---|
| 8 | 9 | 8 | 7665 | 2 | 17 | 16 | 16 |
| 10 | 9 | 8 | 7665 | 3 | 19 | 18 | 19 |
| 13 | 9 | 8 | 7665 | 4 | 22 | 19 | 21 |
| 15 | 9 | 8 | 7665 | 8 | 24 | 20 | 23 |
| 10 | 16 | 16 | 2031585 | 2 | 26 | 25 | |
| 15 | 16 | 16 | 2031585 | 3 | 31 | 28 | |
| 20 | 16 | 16 | 2031585 | 5 | 36 | 32 | |
| 25 | 16 | 16 | 2031585 | 7 | 41 | 35 | |
| 31 | 16 | 16 | 2031585 | 16 | 47 | 36 | |

For illustrative purposes, consider the Fire code given by setting, in equation (3), b=8,16 and p(x) to be an irreducible polynomial of degree m=9 and m=16, respectively so that lcm(2b−1, $2^m$−1) is as large as (2b−1)*($2^m$−1). Refer to TABLE 1 which shows parameters for some burst error correcting codes with maximum Hamming weight constraints derived from the Fire code. The parent Fire code parameters are the rows corresponding to the first columns d(x) containing "15" and "31". The column under b indicates the burst length. The column under n is the code's length. The parameter t refers to the number of errors inside of the burst. The redundancy column writes the number of check bits in the code, which is the sum of the number of bits devoted to the binary error correcting code d(x) and the number of bits devoted to the primitive polynomial p(x) employed in the original Fire construction. For the binary error correcting code, BCH codes are employed with a generator polynomial of the form $\Pi_{i=1}^{2t}(x-\omega^{i+\delta})$ with ω a primitive element in the appropriate field and δ=0, with the exception of the case b=8 and t=4 where it is advantageous to set δ=10.

The expression: $\log_2\left(n\sum_{i=0}^{t-1}\binom{b-1}{i}\right)$ (4)

is a lower bound on the number of bits required. This bound is included in TABLE I for comparison purposes under the "lower bound" column. It can be seen that the codes that have been constructed can have very good redundancy characteristics for the case t=2 where in both examples they are within one bit of the lower bound. For reference purposes, the parameters of the Fire code from which the codes were constructed are also included. To sharpen the lower bound, an exhaustive search is performed over the space of cyclic codes of degree less than the degree given and with the same length. Such a search was conducted for the case b=8 only as the code length in the case b=16 is too large; the results of this search are presented under the column "cyclic lower bound" in TABLE I. From this, it can be seen that within the class of cyclic codes, the example for b=8 and t=3 in TABLE I is exactly optimal, and the case b=8 and t=4 is within 1 bit of optimality.

TABLE II

| deg d(x) | deg p(x) | b | n | $b_m$ | r | d(x) |
|---|---|---|---|---|---|---|
| 10 | 9 | 8 | 7665 | 2 | 19 | 537 |
| 12 | 9 | 8 | 7665 | 3 | 21 | 1249 |
| 15 | 16 | 16 | 2031585 | 2 | 31 | 8faf |
| 20 | 16 | 16 | 2031585 | 3 | 36 | 10cb3b |
| 21 | 16 | 16 | 2031585 | 4 | 37 | 23a171 |

Bursts with Multiple Solid Bursts Based on the Fire Construction.

This section describes embodiments for designing codes for a single burst of errors that could contain small bursts inside (such as a multiple solid burst error 106 as shown in FIG. 1). As before, the term $x^{2b-1}-1$ is substituted in the generator polynomial for a Fire code (Equation 3) with a suitable divisor d(x) of $x^{2b-1}-1$. This can be done in light of Lemma 1, which guarantees that the burst weight function can also be used when constructing codes.

Embodiments described herein are directed to correcting a multiple solid burst error of length b containing at most two mini-bursts of length $b_m$ each. For example purposes only, the description will focus on b=8,16 as before and $b_m$=2, 3, 4. It will be appreciated that other values of b and $b_m$ may also be implemented by exemplary embodiments. For the case b=8 (resp b=16) codes of length 15 (resp. 31) that can correct up to 2 bursts of length at most $b_m$ each are needed. Good choices for such codes (to be used as the divisor d(x)) have been derived using computer search techniques. TABLE II gives the characteristics of the codes for structured bursts derived this way, including the sample divisors d(x). TABLE II depicts parameters for burst error correcting codes with the multiple solid burst containing at most 2 mini-bursts of length at most $b_m$. The coefficients of d(x) are encoded as hex characters.

Codes Induced from the Burton Construction.

The following describes embodiments for correcting a single phased burst by modifying the Burton code, which is closely related to the Fire code. If p(x) is a polynomial of degree b and exponent e, and p(x) is relatively prime with $x^b$−1, then the Burton code is generated by:

$$(x^b-1)p(x).$$

This code has length n=eb, and can correct any burst of length b or less which is confined to positions $x^{ib}, x^{ib+1}, \ldots, x^{ib+b-1}$, for 0≤i<e.

Suppose as in, the section above describing codes for bursts with maximum Hamming weight based on the Fire construction, it is desired to correct a single burst of errors where the burst has Hamming weight at most t. Choose p(x) to be primitive. Suppose that b=$2^w$−1 for some w>0, and let d(x) denote the generator of a cyclic code with minimum distance 2t+1, with the property that d(x) is coprime with p(x). Then d(x)p(x) is the generator of a code with the desired property.

If $d(x)$ is chosen to be a BCH code, then its redundancy is at most $t\lceil \log_2(b+1) \rceil$ and then the redundancy of the code for limited weight bursts is at most $t\lceil \log_2(b+1) \rceil + b$. By comparing with equation (6) (where m=b would be set), it can be seen that the main effect of the restriction to phased bursts is to improve redundancy by approximately t bits.

Codes Induced from the Gilbert Construction.

The Gilbert codes are given by:

$$g(x) = lcm(x^{n_1} - 1, x^{n_2} - 1) \quad (7)$$

where $n_1$ and $n_2$ are coprime and $n = n_1 n_2$ is the length of the code. Suppose that $n_1$ and $n_2$, in addition to being coprime, are of the form $n_1 = 2^{j_1} - 1$, $n_2 = 2^{j_2} - 1$ for some $j_1 \neq j_2$. This gives great flexibility in choosing divisors $d_1(x)$ and $d_2(x)$ of $x^{n_1} - 1$ and $x^{n_2} - 1$, respectively, since the factorization of $x^{n_i} - 1$ in its splitting field contains every term of the form $x - \omega$ where $\omega$ is any nonzero element of the field $GF(2^{j_i})$ Now let $d_1(x) | x^{n_1} - 1$ and $d_2(x) | x^{n_2} - 1$ generate codes with Hamming distance $t+1$. Through two sequential applications of Theorem 1, it can be concluded that:

$$lcm(d_1(x), d_2(x)) \quad (8)$$

generates a code of length $n_1 n_e$ that can correct a single burst with weight t or less.

For example if $n_1 = 7$, $n_2 = 15$ it is known from TABLE I above, that the burst error correcting ability of the corresponding Gilbert code is b=6. Such a code would have a length of 105. Suppose it is desired to correct bursts of length at most 6 with weight 2. By choosing the divisors $d_1(x)$ and $d_2(x)$ to be BCH codes of distance 5 each, we obtain from equation (7) a code with redundancy 14 that achieves this goal, in comparison with the redundancy of the originating Gilbert code which is 21.

An Extension to Solid Bursts.

In embodiments, in order to correct solid bursts of errors with a maximum length constraint, one can chose for the first code a code that is able to correct solid bursts of errors with a maximum weight constraint, and combine it with cyclic linear codes for binary random errors together with adding a received codeword with a 1-bit shifted version of itself. The result is still a codeword due to the cyclic and linear properties, but the solid error is transformed into 2 binary errors. The performance of the resulting codes for structured bursts is closely related to that of the earlier discussion, and thus omitted. Thus for example one can correct one solid burst.

Embodiments described herein include a code modification technique that allows a reduction in the redundancy of existing codes whenever the target error class has additional constraints that can be taken advantage of. As described herein, this was applied to the problem of correcting bursts with limited Hamming weight, bursts with multiple bursts inside and bursts with solid errors by modifying the Fire, Burton and Gilbert codes. The redundancy of several embodiments is either within 1 bit of optimality or strictly optimal within the class of cyclic codes.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for generating encoded data, the method comprising:

receiving data comprising a plurality of subsets of data;

encoding the data, by an encoder, using a structured burst error correcting code, the structured burst error correcting code generated by combining a first error correcting code and a second error correcting code, the structured burst error correcting code including a number of redundancy bits that is within one bit of a redundancy lower limit, the first error correcting code configured to provide error recovery from a structured burst error in one of the subsets of data, the structured burst error having a length less than a specified maximum length and a burst error pattern that is one of a sparse burst error, a solid burst error, and a multiple solid burst error, wherein the first error correcting code is selected from a plurality of error correcting codes based on the burst error pattern; and the second error correcting code configured to extend the first error correcting code to provide error recovery from the structured burst error in any of the subsets of data; and outputting the encoded data.

2. The method of claim 1, wherein the burst error pattern is the sparse burst error, the sparse burst error having a weight less than a specified maximum weight.

3. The method of claim 1, wherein the burst error pattern is the solid burst error.

4. The method of claim 1, wherein the burst error pattern is the multiple solid burst error.

5. The method of claim 1, wherein the receiving is from the output of a differential feedback equalization receiver.

6. The method of claim 1, wherein the first error correcting code is a cyclic code.

7. The method of claim 1, wherein the first error correcting code is a Bose, Chaudhuri and Hocquenghem (BCH) code.

8. The method of claim 1, wherein the second error correcting code is generated by a polynomial that is irreducible.

9. The method of claim 1, wherein the combining the first error correcting code and the second error correct code includes generating the product of two polynomials.

10. The method of claim 1, wherein the first error correcting code utilizes codewords of a first length, the second error correcting code utilizes codewords of a second length, and the combination of the first error correcting code and the second error code utilizes codewords of a third length that is larger than both the first length and the second length.

11. A computer program product for generating encoded data, the computer program product comprising:

a non-transitory storage medium readable by a processing circuit and storing instructions for execution by the processing circuit for performing a method comprising:

receiving data comprising a plurality of subsets of data;

encoding the data, by an encoder, using a structured burst error correcting code, the structured burst error correcting code generated by combining a first error correcting code and a second error correcting code, the structured burst error correcting code including a number of redundancy bits that is within one bit of a redundancy lower limit, the first error correcting code configured to provide error recovery from a structured burst error in one of the subsets of data, the structured burst error having a length less than a specified maximum length and a burst error pattern that is one of a sparse burst error, a solid burst error, and a multiple solid burst error, wherein the first error correcting code is selected from a plurality of error correcting codes based on the burst error pattern, and the second error correcting code configured to extend the first error correcting code to provide error recovery from the structured burst error in any of the subsets of data; and outputting the encoded data.

12. The computer program product of claim 11, wherein the burst error pattern is the sparse burst error, the sparse burst error having a weight less than a specified maximum weight.

13. The computer program product of claim 11, wherein the burst error pattern is the solid burst error.

14. The computer program product of claim 11, wherein the burst error pattern is the multiple solid burst error.

15. The computer program product of claim 11, wherein the first error correcting code is a cyclic code.

16. The computer program product of claim 11, wherein the first error correcting code is a Bose, Chaudhuri and Hocquenghem (BCH) code.

17. The computer program product of claim 11, wherein the second error correcting code is generated by a polynomial that is irreducible.

18. The computer program product of claim 11, wherein the receiving is from the output of a differential feedback equalization receiver.

19. A system for generating encoded data, the system comprising:

an encoder, the system configured to perform a method comprising:

receiving data comprising a plurality of subsets of data;

encoding the data, by the encoder, using a structured burst error correcting code, the structured burst error correcting code generated by combining a first error correcting code and a second error correcting code, the structured burst error correcting code including a number of redundancy bits that is within one bit of a redundancy lower limit, the first error correcting code configured to provide error recovery from a structured burst error in one of the subsets of data, the structured burst error having a length less than a specified maximum length and a burst error pattern that is one of a sparse burst error, a solid burst error, and a multiple solid burst error, wherein the first error correcting code is selected from a plurality of error correcting codes based on the burst error pattern, and the second error correcting code configured to extend the first error correcting code to provide error recovery from the structured burst error in any of the subsets of data; and outputting the encoded data.

20. The system of claim 19, wherein the burst error pattern is the sparse burst error, the sparse burst error having a weight less than a specified maximum weight.

* * * * *